United States Patent [19]

Belke, Jr. et al.

[11] Patent Number: 4,679,122
[45] Date of Patent: Jul. 7, 1987

[54] METAL CORE PRINTED CIRCUIT BOARD

[75] Inventors: Robert E. Belke, Jr., Clay; Raymond A. Shirk, North Syracuse; Hsiu H. Lin, Syracuse; Louis Zakraysek, Cicero, all of N.Y.

[73] Assignee: General Electric Company, Syracuse, N.Y.

[21] Appl. No.: 886,751

[22] Filed: Jul. 11, 1986

Related U.S. Application Data

[63] Continuation of Ser. No. 658,744, Oct. 9, 1984, abandoned, which is a continuation-in-part of Ser. No. 455,109, Jan. 3, 1984, abandoned.

[51] Int. Cl.⁴ .................................................. H05K 1/05
[52] U.S. Cl. ...................................... 361/414; 174/68.5; 524/600
[58] Field of Search ................... 361/414; 524/600; 174/68.5

[56] References Cited

U.S. PATENT DOCUMENTS

| | | | |
|---|---|---|---|
| 3,375,297 | 3/1968 | Barth et al. | 260/823 |
| 3,954,710 | 5/1976 | Bower | 524/600 X |
| 3,983,093 | 9/1976 | Williams et al. | 524/600 X |
| 4,087,300 | 5/1978 | Adler | 156/184 |
| 4,336,100 | 6/1982 | Passlick | 156/630 |
| 4,353,954 | 10/1982 | Yamaoka et al. | 174/68.5 X |
| 4,377,652 | 3/1983 | Ohmura et al. | 524/600 X |
| 4,470,944 | 9/1984 | Asakura et al. | 524/600 X |

OTHER PUBLICATIONS

Robert T. Lovell, FEP Fluorocarbon Film as an Adhesive Dielectric in Electronic Packaging, Insulation/Circuits, Oct. 1971, pp. 45–47.

Primary Examiner—R. R. Kucia
Attorney, Agent, or Firm—Richard V. Lang; Carl W. Baker; Fred Jacob

[57] ABSTRACT

A novel metal core printed circuit board and a method of making it are described. The circuit board comprises a metal substrate, a patternable metal foil, and an insulating layer of thermoplastic resin whose glass transition temperature is exceeded during assembly under pressure to bond the resin to the metal substrate and to the foil by high temperature wetting. The circuit board also provides holes whose interior is lined with a resin united fusing to the resin in the insulating layer by high temperature wetting accompanied by pressure. The thermoplastic resin is a polyetherimide engineering plastic. The layers of the printed circuit board described above, including any additional layers of insulating resin and foil, may be bonded in a single step in a laminating press. The finished circuit board may be a structural component of a chassis, has good heat conductivity, good high voltage performance, is practical for high frequency transmission paths, is tolerant of the high temperature necessary for soldering, and has a high continuous service temperature.

15 Claims, 9 Drawing Figures

METAL CORE PRINTED CIRCUIT BOARD

CROSS REFERENCE TO RELATED APPLICATION

This application is a continuation of application Ser. No. 658,744, filed Oct. 9, 1984, now abandoned, which is a continuation-in-part of copending U.S. application Ser. No. 455,109, filed Jan. 3, 1984, on an invention of Messrs. Belke, Shirk, Lin, and Zakraysek, entitled "IN-SULATED PRINTED CIRCUIT BOARD" now abandoned.

BACKGROUND OF THE INVENTION

1. Field of the Invention

This invention relates to metal core printed circuit boards, and, more particularly, to such a printed circuit board and a method of making a printed circuit board having a single adhesive-dielectric layer bonding a metal substrate to a conductive foil layer.

2. Description of the Prior Art

There is a continuing need in the industry for a better circuit board. The usual qualities of a circuit board include greater rigidity, greater heat management properties, susceptibility of operation at higher temperatures, better resistance to high voltage breakdown, a "good" dielectric constant for efficient high frequency paths, better manufacturability—and the list could go on.

The emphasis on these qualities changes with the application. In home electronic equipment such as television receivers and audio amplifiers, the circuit board is required to support relatively massive electrical components such as transformers, inductors, and filter capacitors. In this application, it is desirable that the circuit board be of sufficient strength to support the components. In this application, high voltages may be present and good resistance to high voltage breakdown is important.

In many electronic applications, the electronic components frequently generate heat, and it is desirable that the circuit board participate in the heat management design. This may require that the circuit board provide good thermal conduction paths and diffuse the heat produced by a particular heat generating component over a larger area or carry the heat to some external heat sink for removal. A companion requirement of the above application is that the circuit board be tolerant of high operating temperatures, since a thermal gradient will usually exist between the warmer interior of the equipment and the ambient.

The dielectric and thermal properties of the circuit board may become jointly important in high frequency applications. The circuit board may be required to dissipate the several watts of heat generated in a single chip, while at the same time providing an efficient high frequency path of normal impedance to the chip. For efficient high frequency paths, the quality of adhesion of the dielectric to the substrate should be high and the dielectric constant should ordinarily be low.

Finally, the circuit board should be easily manufactured. It is desirable that the assembly of the circuit board be of minimal complexity, and that it withstand the elevated temperatures necessary to assembling the components usually at solder temperatures without injury.

A number of designs have been employed in the prior art for the production of insulated printed circuit boards. Two of the practical requirements of board construction, mentioned above, are secure bonding of the metal core to the metal foil layer and adequate dielectric strength to provide electrical insulation of the foil from the substrate. As shown in FIG. 1A, a typical prior art printed circuit board includes a core layer of aluminum 10 coated by insulating layers 12 and 14 of anodized aluminum layer 14. This printed circuit board requires an anodizing process and an epoxy bonding process to produce the board. The copper layer 18 can be chemically etched to produce the desired metallization pattern. The resultant board has a dielectric breakdown level determined by the thickness and uniformity of the anodized aluminum layers, typically of about 1.0 kilovolt. This construction presents significant problems when holes through aluminum plate 10 are required, since the walls of holes in the plate do not anodize well.

In FIG. 1B, the printed circuit board uses layers 20 and 22 of electro-deposited acrylic as insulating layers, rather than anodized aluminum, and an adhesive layer 24 to bond the copper layer 18 to the acrylic layer 22. In order to insulate through holes in plate 10, the acrylic is electro-deposited in the holes. Producing this board construction also requires separate insulating and bonding steps. Boards of this type have a typical dielectric breakdown level of about 2.0 KV.

In the board construction shown in FIG. 1C, the aluminum plate 10 is bonded by adhesive layer 26 to a Kapton ® polyimide insulation layer 28, which is bonded to copper foil layer 18, by another adhesive layer 30 (Kapton ® is a registered trademark of E. I. du Pont de Nemours and Co.). The insulation layer 28 produces a typical dielectric breakdown level of about 8.0 KV for a 2.0 mil thick polymide layer. Again, separate insulating and bonding steps are required.

Another prior art construction, shown in FIG. 1D, employs a second polyimide layer 32 for insulation and a second adhesive layer 34 for bonding the copper layer 18 to metal substrate 10 requiring separate bonding and insulating steps. This construction has a typical dielectric breakdown level of about 8.0 KV for a total polyimide thickness of 3.0 mils.

SUMMARY OF THE INVENTION

An object of the present invention is to provide an improved metal core printed circuit and an improved technique for producing metal core, insulated printed circuit boards.

It is another object of the invention to provide a metal core printed circuit board which is susceptible of operation at higher continuous service temperatures.

It is still another object of the present invention to provide an improved printed circuit board which is readily manufactured and readily withstands the elevated temperatures required for assembly of the components thereon.

A more specific object of the present invention is to provide a process of fabricating printed circuit boards in which the bonding of the core metal to the conducting layer and the insulating of the core metal from the conducting layer including the insulating of perforations in the core metal is performed in a single step.

Accordingly, the present invention includes a technique for bonding a properly prepared metal core substrate for a printed circuit board to a conductive foil layer with an insulating layer of thermoplastic resin which is bonded to the substrate and to the conductive foil layer by high temperature wetting accompanied by pressure and which also insulates the substrate from the conductive foil layer with an insulator of adequate dielectric strength to provide the required breakdown voltage. The technique of the present invention also includes providing concurrently with the bonding of the substrate to its insulating layer insulation for through holes in the metal substrate. The thermoplastic resin herein provided has a glass transition temperature in excess of the melting point of solder, and is heated in excess of that temperature during the procedure. The preferred thermoplastic resin is a polyetherimide engineering plastic based on bisphenol A dianhydride reacted with metaphenylene diamine.

The present invention includes the printed circuit board produced by the novel technique.

BRIEF DESCRIPTION OF THE DRAWINGS

Features of the invention believed to be novel and unobvious over the prior art are set forth with particularity in the appended claims. The invention itself, however, as to organization, method of operation and best mode contemplated by the inventors, together with further objects and advantages, may best be understood by reference to the following description taken in conjunction with the accompanying drawings, in which like reference characters refer to like elements throughout, and in which:

DESCRIPTION OF THE PREFERRED EMBODIMENTS

Figure 1A:
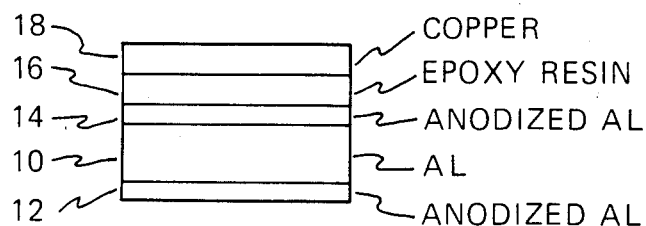
FIGS. 1A-1D are schematic cross-sectional views of prior art printed circuit boards in which layer thickness is exaggerated for purposes of illustration.
Figure 1B:
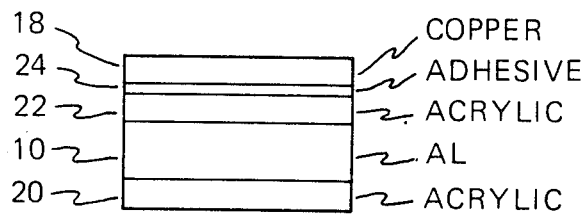
Figure 1C:
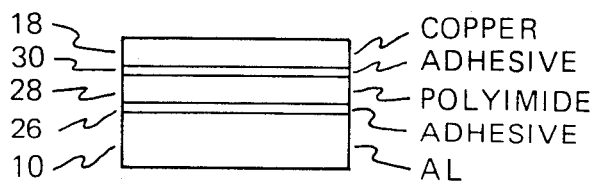
Figure 1D:
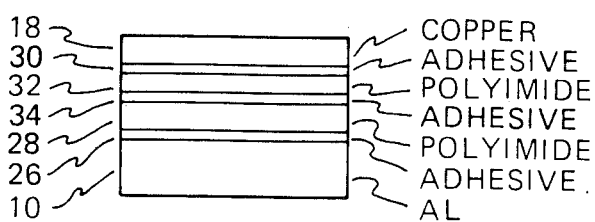

In the printed circuit board assembly technique of the present invention, the two requirements of a secure bond and adequate dielectric strength between the metal core and the metal foil are satisfied by a single insulating layer of thermoplastic resin which is heated to temperatures in excess of the glass transition temperature. The procedure causes wetting by the resin of the substrate and of the foil. When the heat is accompanied by pressure, a bond which is strong at temperatures below the glass transition temperature is formed. The printed circuit board assembly technique of the present invention is accomplished in a single bonding step as illustrated schematically in FIG. 2. A metal core substrate 40 of a suitable metal, such as aluminum, a layer 42 of a material providing both adhesive and insulating properties having a surface congruent with the substrate 40, and a layer 44 of conductive metal foil, such as copper foil, having the required dimensions for making the required connections for the board are placed between the opposed plates 46 and 48 of a lamination press. Steel platens 50 and 52 are inserted to provide uniform pressure on the plates 46 and 48, respectively, and mica mat sheets 54 and 56 to provide a non-adhering surface in contact with the copper and aluminum layers are placed between the plates 46, 48 of the lamination press and the layers of the printed circuit board being fabricated. The press is pre-set to about 575° Fahrenheit. The press is closed and held at about 1200 psi for about ten minutes, after which the pressure is released and the assembly is air cooled to ambient temperature. The foil is then etched to form the electrical circuit desired.

The proper surface condition of the aluminum plate 40 is important in promoting bond strength between the aluminum plate 40 and the insulating layer 42. The surface of the aluminum plate must be free of any grease, dirt or other contaminants and must have a surface texture which promotes secure adhesion between the insulating layer and the substrate. Therefore, prior to bonding, the surfaces of the aluminum plate 40 are degreased. Then the surface to be bonded to the adhesive-dielectric layer is sand or glass bead blasted to roughen the surface and enhance adhesion between the aluminum plate and the insulating layer. The adhesive properties of the plate surface may be enhanced by zincating either alone or together with the sand or glass bead blasting.

The proper surface condition of the copper foil 44 is important in promoting bond strength between the foil 44 and the insulating layer 42. The copper foil may be procured with a "copper-treat" surface treatment for enhancement of its adhesion to resin. The treatment, which may be applied to untreated copper without use of proprietary processes, achieves a bonding surface of a red oxide of copper, black order of copper, or a yellow oxide of a copper-brass alloy. This prepared surface is maintained clean and is kept from exposure to contamination until the printed circuit board is assembled in the lamination press.

A key to the successful manufacture of the printed circuit board of the present invention is the use of a single layer of polyetherimide thermoplastic resin which has both insulating properties and adhesive properties when heated to a temperature in excess of the glass transition temperature. Upon heating to this temperature, the resin softens and yields to applied pressures conforming to confining surfaces. In addition, wetting of these surfaces occurs at these high temperatures initiating an intimacy of contact, which upon cooling below the glass transition temperature forms a bond. At ambient temperatures and temperatures below the glass transition temperatures, the bond is strong.

The key to improved performance of the printed circuit board is also the polyetherimide thermoplastic resin. Printed circuit boards, after patterning of the foil for conductive runs (and treatment of through holes—not illustrated in the FIG. 2 assembly) are then subjected to soldering temperatures during attachment of the electronic components which these circuit boards support and provide electrical connections to. Customary low temperature solders expose the circuit boards to temperatures of from 185° C. to 200° C. The polyetherimide resin herein described is an engineering plastic, which has a glass transition temperature of 219° C. (426° F.), and which is therefor not weakened or damaged during a soldering process. The continuous service temperature of a finished board is also high 170° C. (338° F.).

A particularly preferred resin is Ultem ® resin (Ultem ® is a registered trademark of the General Electric Company).

The resin referred to above which is popularly characterized as a "polyetherimide", is the subject of U.S. Pat. No. 3,847,867 to Heath and Worth, which is assigned to General Electric. The resin may be further characterized as an engineering plastic in reference to its usefulness in structural and mechanical applications, and is based on bisphenol A dianhydride reacted with metaphenylene diamine. By using a thermoplastic resin, and utilizing both insulating and adhesive properties brought into operation by heating the assembly of the metal core printed circuit boards is achieved in a single step with a lamination press as the only required equipment.

The adhesive quality of the resin is a result of the thermoplastic property. Upon elevating the temperature of the resin above the glass transition temperature, it softens, and sets adjoining metallic surfaces with which it is in intimate contact. In the laminating press this temperature (426° F.) is exceeded by approximately 100° F. With the application of suitable pressure, the resin flows and the desired intimacy of contact with the confining metallic surfaces is achieved. Cooled below the transition temperature, the bond becomes strong, and remains strong under exposure to relatively high processing or use temperatures as noted above. Since the process is one of a simple change in physical state, not involving creating or destroying molecular linkages, special curing of the adhesive is unnecessary and special processing equipment and special atmosphere enclosures are not required.

Figure 3:
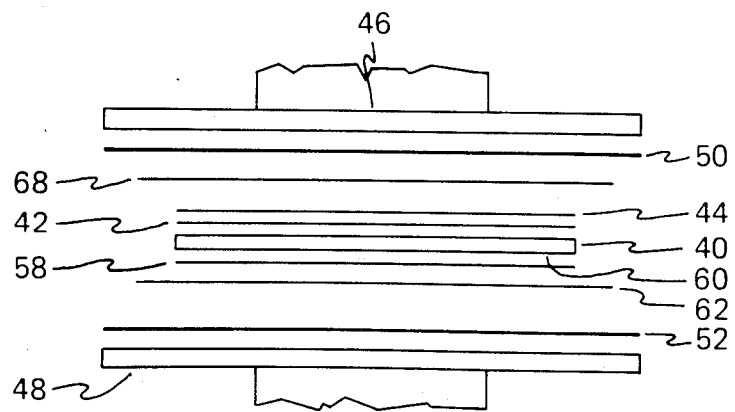
FIG. 3 is a partial schematic view of an alternative assembly technique of the present invention.

If desired, an insulating layer of resin may be applied to the aluminum plate to protect the surface of plate 40 opposite the sheet 42. As shown in FIG. 3, a layer 58 of resin is placed adjacent the surface 60 of aluminum plate 40. A release sheet 62, of for example, polytetrafluoroethylene coated glass fabric, such as Chemical Fabrics Corporation, EHV-4, -6 or -10, or a polyimide, such as Kapton ® polyimide, is then placed between the resin sheet 58 and the steel platen 52 to provide a non-adhering surface in contact with the thermoplastic resin layer 58. Another release sheet 68 is placed between the layer 44 of conductive metal foil and the steel platen 50 to provide a non-adhering surface in contact with the foil layer 44 during the lamination process. By applying the same temperature of about 575° F. and pressure of about 1200 psi to the assembly for ten minutes and then air cooling to ambient temperature, a printed circuit board having an insulated surface on one side and a copper conductor on the other is produced. This single lamination step assembly of a metal core insulated printed circuit board provides a reliable, inexpensive assembly for printed circuit boards. The layer 58 of resin provides protection of the aluminum plate 40 from chemical degradation during etching processes used to etch the copper foil during patterning.

In many applications of the printed circuit board, it is desirable to provide holes, through the aluminum substrate, through which conductors, insulated from the substrate must pass, and which would make electrical conduction to the patterned foils on the two surfaces of the board. Insulated through-holes, need not, however, connect elements of two patterned foils, but may be used, for instance, to permit connections to be taken from the surface of the board remote from the patterned foil.

In the production of through-holes, the substrate 40 is drilled producing burrs. These burrs must be removed, and a uniform insulating layer deposited over the surface of the holes to ensure that no electrical shorts will result from contact between conductors passing through the holes and the surface of the holes. Holes are drilled through the aluminum plate 40, and the holes deburred. The aluminum plate is then degreased and glass bead or sand blasted to produce a clean, grease free surface to promote bonding between the insulating sheet and the substrate 40. Zincating may be used together with or instead of the glass bead or sand blasting to further promote adhesion between the insulating sheet and the aluminum substrate.

Figure 4:
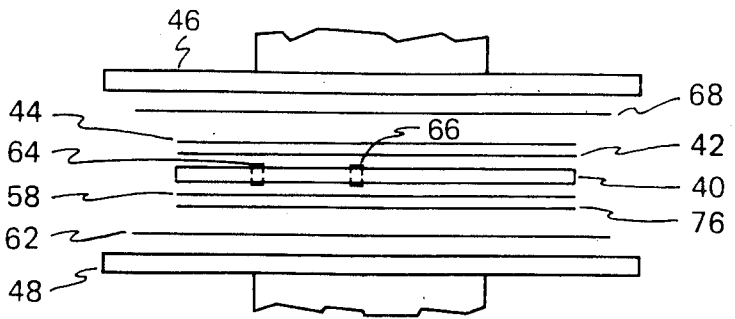
FIG. 4 is a partial schematic view of yet another alternative assembly technique of the present invention.

The present invention provides an improved technique for insulating such boards and through-holes. In accordance with the invention, predrilled holes in the aluminum plate 40 are insulated as shown in FIG. 4. Cylindrical plugs 64 and 66 of thermoplastic resin are placed in predrilled holes in the aluminum plate 40 with the plate resting upon a sheet of polyetherimide resin and that sheet in turn resting upon a layer 76 of treated copper foil in the laminating press.

The plugs are available in selected diameters and are cut to the desired length prior to placement in the holes. The quantity of resin in the plugs should be at least equal to the volume of the holes, and preferably slightly in excess, to insure the continuity of the insulation. After installation of the plugs, the resin layer 42 and the foil layer 44 are applied to complete the assembly which is laminated. The resin and metal foil layers are assembled as shown in FIG. 4. Slip sheets 62 and 68 are placed between the platens 48 and 46, respectively, and the printed circuit board. During the lamination process the press is preheated to about 575° F., and then closed, and a pressure of about 1200 psi at 575° F. is applied for about ten minutes. The plugs 64 and 66, heated well above the glass transition temperature and under pressure deform to fill the holes and at high temperature wet the walls of the holes. A first result of the procedure is secure adhesion of the resin to the walls of the hole at ambient temperatures. A second result of the procedure is that where the fused resin material of the plugs (64, 66) comes in contact with the resin material of the sheets (42, 58), they mutually unite by mutual wetting or mixing. Thus a secure union by fusion occurs between the resin material provided by the plugs to fill the perforations and the surface layers of resin 42 and 58. The finished boards may be cooled by supplying cooling water or air to the platens for a time sufficient to cool the finished printed circuit board to the desired temperature. After cooling to ambient temperature holes of small diameter compared to the diameter of the predrilled holes are drilled through the material filling the perforations to provide insulated passages through the aluminum plate 40. Care must be exercised in drilling to ensure that at no point is the resin completely removed from the metal surface of the holes. In this way the hole filling, laminating and metallization steps may be accomplished in a single step. Electroless plating of through holes may be accomplished at this time to interconnect the exposed metallic outer layers (in FIG. 4, layers 44 and 76).

In experiments using the claimed process including the above described hole and surface preparation steps, aluminum plates 64 mils thick and copper foil of 1.0 oz. copper, about 1.4 mils thick were bonded by using a 3 mil thick extruded sheet of Ultem ® resin. The circuit boards consistently showed 90° peel strengths of 8–10 lbs/inch and dielectric strengths of 4000 to 5000 volts. It is to be understood that the dielectric strength can be controlled by selecting the thickness of the layer of resin.

Figure 5:
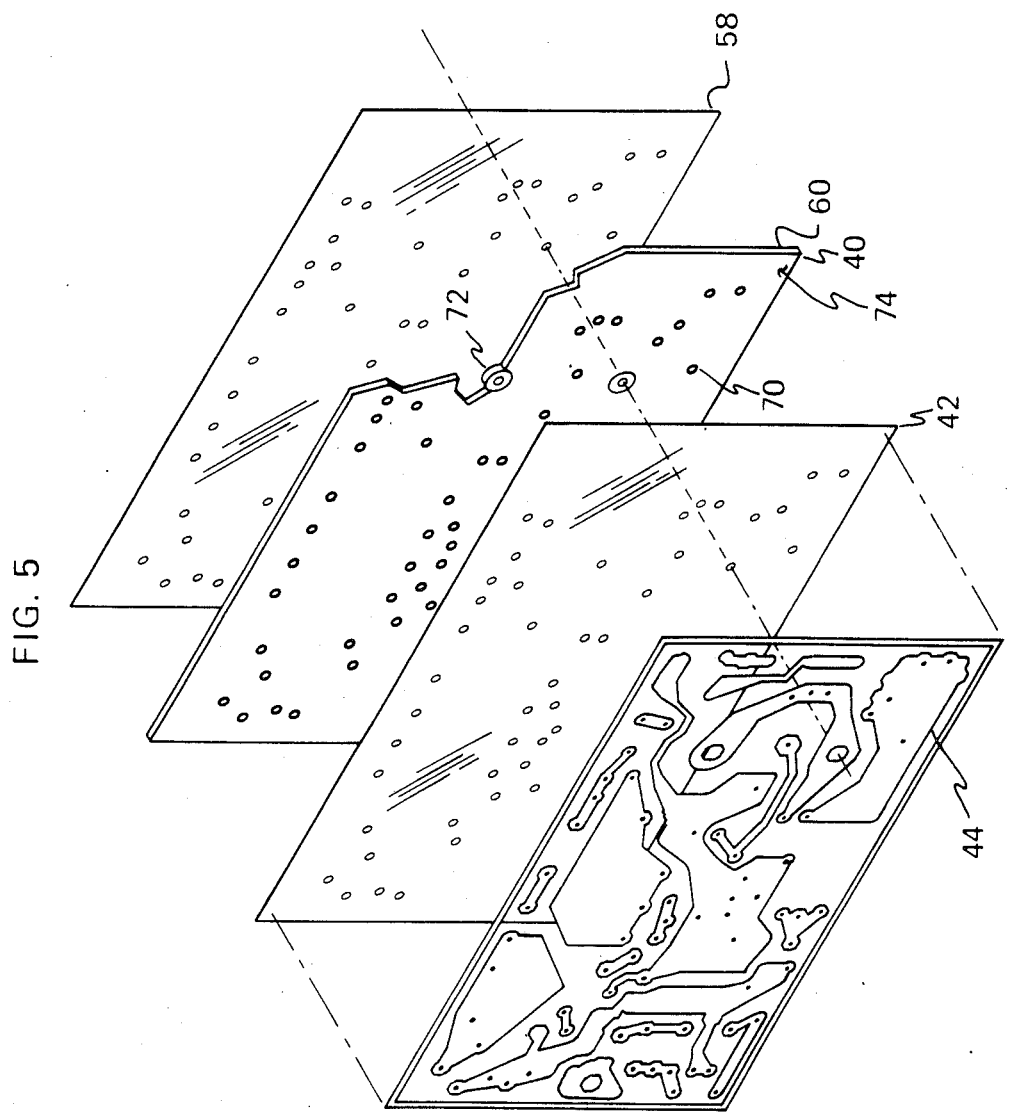
FIG. 5 is an exploded pictorial view of a printed circuit board fabricated according to the present invention.

An exploded view of a printed circuit board made by the present invention is shown in FIG. 5. The substrate 40 with the predrilled holes 70 having the virtual cylindrical insulating sleeves 72 bonded therein has a first insulating sheet 58 covering one major surface 60 and a second insulating sheet 42 covering the other major surface 74. The resinous material in the holes and in the sheets, as earlier described, unites by fusion at the elevated processing temperatures forming a continuous insulating barrier. The copper foil sheet 44 is bonded to sheet 42 and is etched to form the necessary electrical connections for the printed circuit board design required. The complete assembly after etching provides an aluminum core 40 completely insulated by the resin sheets 58, 42 and virtual resin sleeves 72 from any electrical conductors mounted on or passing through the board.

Figure 6:
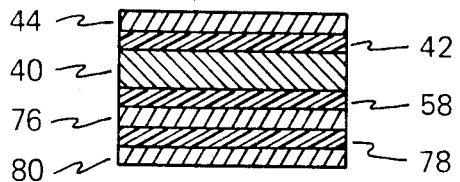
FIG. 6 is a schematic cross-sectional view of a particular embodiment of a printed circuit board of the present invention.

In many applications of printed circuit boards multiple layers of conductor are required. The present invention accommodates this requirement by allowing layers of polyetherimide resin to be alternated with layers of metal foil, as shown in FIG. 6, in which the thickness of layers is exaggerated for purposes of illustration. The substrate 40, resin layers 42 and 58 and the metal foil layers 44 and 76 are bonded in a first bonding step by a lamination press arrangement as shown in FIG. 3 heated to about 575° F. with a pressure of about 1200 psi for about ten minutes. The assembly is then cooled and the foil layers 44 and 76 are etched to the desired circuit configuration. This produces a two-sided printed circuit board with a single step of bonding and insulating the foil layers from the substrate.

If additional layers of conductor are required, following etching of the bonded foil layers 44 and 76, an additional layer 78 of polyetherimide resin and an additional layer 80 of conductive metal foil are juxtaposed with foil layer 76. Another bonding step in the lamination press at about 575° F. and about 1200 psi for about ten minutes bonds the layers 78 and 80 to the assembly to form a stack of alternating layers of foil and resin. Foil layer 80 is then etched to form the additional circuits required. This sequence of steps of stacking layers, bonding and etching may be repeated as required to produce as many conductive layers insulated from each other as are required for the printed circuit board being assembled. If perforations are required through the inner layers of resin and metal foil to access the outer layers of foil, insulating plugs as shown in FIG. 4 may be inserted into holes in the assembly to provide insulated passages through the inner layers of the assembly.

The multilayer assembly of FIG. 6 may be made by an alternative method. Layers 44, 76 and 80 of conductive metal foil may be bonded to respective layers 42, 58 and 78 of polyetherimide, and then etched to the desired circuit configuration. The prebonded etched foil resin combinations are then stacked and the entire assembly heated under pressure as described above to bond the layers together to form a complete assembly, which upon further, through hole processing, leads to the completed circuit board.

Figure 2:
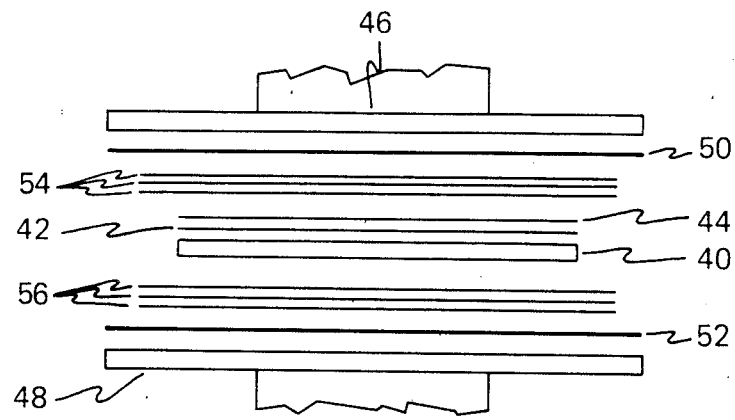
FIG. 2 is a partial schematic view of a printed circuit board assembly technique of the present invention.

The temperature and pressure may need to be applied for a period of time different from the ten minutes required for the assembly processes illustrated in FIGS. 2–4, or the temperature and pressure may be varied within the limits of thermoplastic action of the resin. After assembly of the printed circuit board a heat sink of an appropriate material, e.g., aluminum may be attached to the board to allow use of the board for high temperature environment use.

The present invention provides a printed circuit board fabrication process which does not require a step of application or curing of an adhesive separate from the step of insulating the metal core substrate. The printed circuit boards provided are inexpensive, reliable and compatible with materials and manufacturing processes in which printed circuit boards are used. Therefore, a substantial improvement in printed circuit boards and their assembly is provided by the present invention.

In the lamination process exemplary conditions have been proposed. In practice, the temperature during lamination must exceed the glass transition temperature of the resin. This temperature 219° C. (426° F.) is too low for traditional lamination processing and the temperature is substantially exceeded. In practice, reasonable softening of the resin occurs at about 550° F. consistent with reasonable pressures in the laminating press. At temperatures in excess of 600° F. the resin becomes too soft and is subject to undesired oxidation. Accordingly, a reasonable variation of ±25° F. (about 575° F.) is consistent with the present materials and processing apparatus. As the temperature is varied, the softness varies. Accordingly, the pressure will normally have to be increased as the temperature falls, and decreased as the temperature rises. Also, the time of the operation is largely controlled by the specifics of the application. Typically a working time of from 1 to 15 minutes is most practical, the smaller, thinner samples normally requiring less time in the press.

The foil is tradionally copper, and is the most common material used in forming conductive patterns on organic substrates. The substrate is most often aluminum, but in special applications it may be copper clad nickel iron alloy of low temperature expansion. In the case of copper clad invar substrate, the copper layer should be treated for proper adhesion of the resin as by formation of an oxide.

The invention herein described is useful in the applications earlier mentioned. In television receivers or audio equipment, the metal core, typically aluminum, may be selected to have the desired rigidity to avoid the need for a separate chassis, and the substrate may itself be supported by lower stress, lower priced, plastic parts. In the television application, voltage breakdown ratings in excess of 5000 volts are readily achieved and may be readily increased by increasing the thickness of the dielectric layer.

In other high temperature applications, the polyetherimide permits a continuous service temperature of 170° C. (338° F.), which is substantially higher than competitive epoxy materials.

Finally, the dielectric constant, of the polyetherimide material is low (3.15) suiting it to convenient microstrip transmission lines at conventional impedances.

What is claimed is:

1. A printed circuit board for subsequent solder processing comprising:
   (1) a planar thermally and electrically conductive metallic substrate;
   (2) a layer of conductive metal foil patternable to form said electrical interconnections, and (3) an insulating layer of polyetherimide thermoplastic resin, an engineering plastic based on bisphenol A dianhydride reacted with metaphenylene diamine, having a glass transition temperature in excess of 200 degrees C. to permit exposure to soldering not exceeding said temperature, said resin wetting metallic surfaces at temperatures in excess of said glass transition temperature which upon cooling to ambient temperatures forms a bond, said resin being bonded to said metal substrate and to said foil by high temperature wetting accompanied by pressure.

2. The printed circuit board set forth in claim 1 wherein:
said substrate includes a plurality of perforations passing therethrough and wherein:
additional thermoplastic resin, the same as that in said resinous layer is contained by said perforations, said additional resin being bonded to the vertical walls of said perforations and united by fusing to the resin in said resinous layer by high temperature wetting accompanied by pressure.

3. The printed circuit board set forth in claim 1 wherein:
said substrate is aluminum and said conductive foil is copper.

4. The printed circuit board set forth in claim 1 wherein:
said substrate is a copper clad nickel iron alloy of low temperature expansion and said conductive foil is copper.

5. A printed circuit board for subsequent solder processing comprising:
(1) a planar thermally and electrically metallic conductive substrate;
(2) a layer of conductive metal foil patternable to form said electrical interconnections;
(3) a first insulating layer of polyetherimide thermoplastic resin, an engineering plastic based on bisphenol A dianhydride reacted with metaphenylene diamine, having a glass transition temperature in excess of 200 degrees C. to permit exposure to soldering not exceeding said temperature, said resin wetting metallic surfaces at temperatures in excess of said glass transition temperature which upon cooling to ambient temperatures forms a bond, said resin being bonded to the first surface of said metal substrate and to said foil by high temperature wetting accompanied by pressure; and
(4) a second layer of said thermoplastic resin being bonded to the second surface of said metal substrate by high temperature wetting accompanied by pressure.

6. The printed circuit board set forth in claim 5 wherein:
said substrate includes a plurality of perforations passing through and wherein:
additional thermoplastic resin, the same as that in said resinous layers is contained by said perforations, said additional resin being bonded to the vertical walls of said perforations and united by fusing to the resin in said resinous layers by high temperature wetting accompanied by pressure.

7. A printed circuit board as set forth in claim 6 having an addition thereto:
a second layer of conductive metal foil patternable to form said electrical interconnections,
said second layer of thermoplastic resin being bonded to said second layer of conductive metal foil by high temperature wetting accompanied by pressure.

8. The printed circuit board set forth in claim 7 wherein:
said substrate is aluminum and said conductive foils are copper.

9. The printed circuit board set forth in claim 7 wherein:
said substrate is a copper clad nickel iron alloy of low temperature expansion and said conductive foils are copper.

10. A printed circuit board for subsequent solder processing comprising:
a planar metal substrate;
a first stack of alternating insulating layers of thermoplastic resin and conductive metal foil bonded to one major surface of said substrate;
a second stack of alternating insulating layers of thermoplastic resin and conductive metal foil bonded to the opposite major surface of said substrate; and
each of said layers of thermoplastic resin is the same polyetherimide resin, an engineering plastic based on bisphernol A dianhydride reacted with metaphenylene diamine, having a glass transition temperature in excess of 200 degrees C. to permit exposure to soldering not exceeding said temperature, said resin wetting metallic surfaces at temperatures in excess of said glass transition temperature which upon cooling to ambient temperatures forms a bond, said resin being bonded to said metal substrate and to said foils by high temperature wetting accompanied by pressure.

11. The printed circuit board set forth in claim 10 wherein:
said substrate includes a plurality of perforations passing therethrough and wherein:
additional thermoplastic resin, the same as that in said resinous layers is contained by said perforations, said additional resin being bonded to the vertical walls of said perforations and united by fusing to the resin in said resinous layers by high temperature wetting accompanied by pressure.

12. The invention of claim 11 wherein:
said first stack comprises:
a first layer of thermoplastic resin bonded to said one major surface of said substrate; and
a first layer of etched conductive metal foil bonded to said first layer of thermoplastic resin;
said second stack comprises:
a second layer of thermoplastic resin bonded to said opposite major surface of said substrate;
a second layer of etched conductive metal foil having one major surface bonded to said second layer of thermoplastic resin;
a third layer of thermoplastic resin bonded to the opposite major surface of said second layer of conductive metal foil; and
a third layer of etched conductive metal foil having one major surface bonded to said third layer of thermoplastic resin.

13. The printed circuit board set forth in claim 12 wherein:
said substrate is aluminum, and
said conductive foils are copper.

14. The printed circuit board set forth in claim 12 wherein:

said substrate is a copper clad nickel iron alloy of low temperature expansion, and
said conductive foils are copper.

15. A printed circuit board comprising:
a planar metal substrate;
a layer of polyetherimide thermoplastic resin, an engineering plastic based on bisphenol A dianhydride reacted with metaphenylene diamine, directly bonded to one major surface of said metal substrate; and
a layer of conductive metal foil directly bonded to said layer of thermoplastic resin; said layer of thermoplastic resin comprising an adhesive-dielectric layer bonding said metal substrate to said metal foil and electrically insulating said metal substrate from said metal foil.

* * * * *